United States Patent
Summers et al.

(10) Patent No.: US 7,027,785 B2
(45) Date of Patent: Apr. 11, 2006

(54) TRANSMITTER RF POWER CONTROL

(75) Inventors: Andrew Gordon Summers, Cambridge (GB); Trahern Stuart Rayner, Bucks (GB)

(73) Assignee: Ttpcom Limited, Royston Hertfordshire (GB)

( * ) Notice: Subject to any disclaimer, the term of this patent is extended or adjusted under 35 U.S.C. 154(b) by 0 days.

(21) Appl. No.: 10/494,281

(22) PCT Filed: Nov. 25, 2002

(86) PCT No.: PCT/GB02/05301

§ 371 (c)(1),
(2), (4) Date: May 3, 2004

(87) PCT Pub. No.: WO03/049299

PCT Pub. Date: Jun. 12, 2003

(65) Prior Publication Data

US 2004/0266371 A1 Dec. 30, 2004

(30) Foreign Application Priority Data

Nov. 28, 2001 (EP) .................................. 01309974

(51) Int. Cl.
*H04B 1/04* (2006.01)

(52) U.S. Cl. ................ 455/126; 455/127.1; 455/127.2; 455/522; 455/230; 455/265; 455/264

(58) Field of Classification Search ................ 455/126, 455/127.1, 127.2, 522, 230, 265, 264
See application file for complete search history.

(56) References Cited

U.S. PATENT DOCUMENTS

| | | | |
|---|---|---|---|
| 3,944,945 A | 3/1976 | Corte et al. | |
| 4,484,295 A * | 11/1984 | Bedard et al. | 708/8 |
| 4,683,445 A * | 7/1987 | Erickson | 331/25 |
| 4,795,965 A * | 1/1989 | Dooley | 324/601 |
| 4,999,583 A * | 3/1991 | Washburn et al. | 330/86 |
| 5,054,116 A * | 10/1991 | Davidson | 455/126 |
| 5,151,624 A * | 9/1992 | Stegherr et al. | 327/356 |
| 5,208,549 A * | 5/1993 | Andoh | 330/129 |
| 5,448,770 A * | 9/1995 | Hietala et al. | 455/126 |
| 5,488,379 A * | 1/1996 | Jackson et al. | 342/359 |
| 5,546,050 A | 8/1996 | Florian et al. | |
| 5,548,826 A | 8/1996 | Sayers | |
| 5,694,204 A * | 12/1997 | Nakase et al. | 356/5.15 |
| 5,854,593 A * | 12/1998 | Dykema et al. | 340/825.22 |
| 5,901,347 A * | 5/1999 | Chambers et al. | 455/234.1 |
| 5,907,261 A | 5/1999 | Jones | |

(Continued)

FOREIGN PATENT DOCUMENTS

WO 87/06072 10/1987

(Continued)

*Primary Examiner*—Sonny Trinh
*Assistant Examiner*—Huy Phan
(74) *Attorney, Agent, or Firm*—Dykema Gossett PLLC

(57) ABSTRACT

An electronic system for accurately controlling the RF output power from a power amplifier (21) is implemented using a multiplier (28) which multiplies the output power by itself to provide a DC component which is fed to a variable gain amplifier (29) which provides a controlling signal via a comparator (24) and an integrator (25) to the power amplifier. The transfer function between controlling signal and output power is substantially linear, even during dynamic variation of the controlling signal. The system is capable of a large dynamic range, and exhibits constant control loop bandwidth over this range. This is of particular use to TDMA applications with a large dynamic range of levelled output powers because a fixed filter function can be used to shape the transmitted burst.

9 Claims, 4 Drawing Sheets

U.S. PATENT DOCUMENTS 6,034,604 A * 3/2000 Kaltner ................... 340/572.3
6,259,682 B1 * 7/2001 Brown et al. ............... 370/311
6,493,543 B1 * 12/2002 Shin et al. .................. 455/126
6,801,784 B1 * 10/2004 Rozenblit et al. ........... 455/522

FOREIGN PATENT DOCUMENTS

WO           01/50632       7/2001

* cited by examiner

TRANSMITTER RF POWER CONTROL

BACKGROUND OF THE INVENTION

The present invention relates to radio frequency (RF) power control in a transmitter, particularly a transmitter of a cellular telephone handset.

Many radio transmitter systems require accurate control of the transmitted RF power. This is commonly achieved by a feedback control system in which the difference between the sampled output power from the power amplifier (PA) and a reference control derives an error signal that controls the PA gain. This is a common technique because it is usually far easier to implement accurate power measurement with supply voltage and temperature variation than it is to maintain PA output power within acceptable limits. Additionally, in many radio transmitter applications the output power needs to be accurately set to one of a number of prescribed power levels within some total dynamic range.

TDMA systems usually require the transmitted signal burst to adhere to a strict power versus time template. Thermal heating effects in the PA generally cause PA parameters such as gain and/or efficiency to decrease throughout the burst. A feedback control system can automatically level the transmitted burst, provided of course that there is sufficient control loop bandwidth and power output capability. Also, many TDMA systems require the handset's transmitted power to be smoothly ramped to and from the average burst power. This is commonly specified in order to reduce the amount of adjacent channel interference caused by the power ramp pulse, and/or to limit the power transmitted in adjacent timeslots.

A typical power control loop used in (but not restricted to) mobile radio communications is shown in FIG. 1 of the accompanying drawings. In such a control loop, the transmit power $P_{trans}$ output by a power amplifier 11 (which is fed from a voltage controlled oscillator 10 to an antenna 16) is sampled through a coupler 12 and the value detected in a detector 13 (shown here as a Schottky diode) which outputs a related detector voltage $V_{det}$ which is then compared in a comparator 14 with a controllable reference R. The difference signal is integrated in an integrator 15 and the integrated difference signal $\Delta S$ is fed back and used to adjust the gain of the power amplifier 11 in the appropriate direction in order that the detector voltage $V_{trans}$ moves towards the reference voltage R. This is a classic feedback technique and in this manner, the controllable reference voltage sets the power output and can be dynamically controlled to effect the ramp signals required for example in TDMA system handsets. However, the voltage $V_{det}$ of a diode detector has a square-law relationship to the transmitted (input) power $P_{trans}$ and furthermore at low power levels the exponential characteristic of the Schottky diode dominates the response.

In relation to PA output power variance with respect to control reference, the transfer function of the circuit shown in FIG. 1 is defined solely by the detector's characteristic. Implementations of power detectors are commonly based around either Schottky diodes (as shown) or log-amps. These solutions provide non-linear transfer functions and also have limited dynamic range, especially in the case of Schottky diode detectors. This results in the PA power setting with respect to its control input being non-linear and beyond the control of the equipment manufacturer. The transfer function derivative (gradient) therefore varies with power setting and in implementations using Schottky diodes, the detector usually dominates the overall gradient variation and implicitly the loop bandwidth variation.

Furthermore, variation of control loop bandwidth with power setting is undesirable and results in a varying dynamic response. In GSM (Global Systeme Mobile) systems, which are one form of TDMA system, the ramp profile should ideally be constant with each power setting. Non-linear transfer functions result in the provision of a unique ramp shape at each power setting and this demands extra memory. Moreover, the system is intolerant to unit-to-unit detector and PA variation, as well as power variation (for example over temperature or due to calibration errors).

There is a need therefore to provide a linear control of the RF output power from a handset PA and this is preferably achieved by means of a feedback control system.

According to the present invention therefore there is provided RF transmitter power control system having an oscillator:
- a power amplifier receiving the output of the voltage controlled amplifier as a first input, having a control input, and generating an output signal for passing to an antenna;
- a sampling device for deriving a signal representative of the output signal;
- a multiplier for multiplying the representative signal by itself to provide an output component which is linearly related to the representative signal;
- a variable gain amplifier receiving the linear output component of the multiplier as a first input and having a variable control input as a control reference and an output;
- a comparator for comparing the output of the variable gain amplifier with a reference and producing a difference signal; and
- an integrator for integrating the difference signal and providing it as a control input to the power amplifier.

The way forward to providing a consistent and predictable overall loop transfer function e.g. loop bandwidth, phase margin, is by definition of linear transfer functions for the individual circuit blocks within the loop. The control loop bandwidth is governed by both the derivatives (rate of change) and absolute gain of the block transfer functions. A linear transfer function gives a constant derivative.

Several advantages result from the use of the system of the invention, particularly for TDMA mobile communications applications:
The use of an analogue multiplier to convert the sampled RF signal to a DC voltage results with a linear relationship between the transmitted RF voltage and the detected voltage. This avoids the linearity problems encountered with the use of Schottky diode detectors or log-amplifiers. The dynamic range of the multiplier detector is only limited by its large signal handling and DC offsets or thermal noise at low input signal powers. The method is identical to a 'direct conversion receiver' architecture and implies the dynamic range is significantly greater than existing detector solutions. Furthermore, it is possible to make wideband multiplier circuits that remove any necessity to incorporate switching for operation in different frequency bands, or compensate for the slope in frequency response.

The use of a fixed error detection reference combined with a VGA results in an identical error slope ($dV_{(detected)}/dV_{(transmitted)}$) for all in-lock RF output power settings. This results in a constant control loop bandwidth provided the PA control characteristic is linear. In practice, this is never the case, but is not the dominant cause of control loop bandwidth variation in previous typical implementations.

The use of a VGA operating at DC to control the transmitted RF power can avoid the levelled output RF power drift due to temperature and voltage variation typically experienced in RF circuits.

A result of these is that, provided the practical implementation has sufficient control loop bandwidth and dynamic range, the system is functionally equivalent to the idealised circuit shown in FIG. 9 below, with the control reference filter equivalent to the closed-loop transfer function. In bursted TDMA applications, this results in the ability to profile the transmitted RF signal using a rectangular pulse with height proportional to transmitted RF voltage and pulse shaping implemented by a fixed filtering function effected either by the closed-loop transfer function of by an additional dominant filtering function in the control reference connection. In practical mobile handset applications, this means that a single ramp shape can be used together with a scaling multiplication factor to achieve identical ramp shapes at any transmit RF power. This also means there is no need to use different ramp shapes or incorporate any sensitivity switching between frequency bands of operation.

An electronic circuit as proposed is capable of being implemented for power amplifier operation at very high frequencies as an integrated circuit or by other suitable components.

The system can of course be used for non-TDMA applications.

One example of an RF power control loop according to the invention will now be described with reference to the accompanying drawings, in which:

FIG. 2 a block diagram of the control loop;

Figure 1:
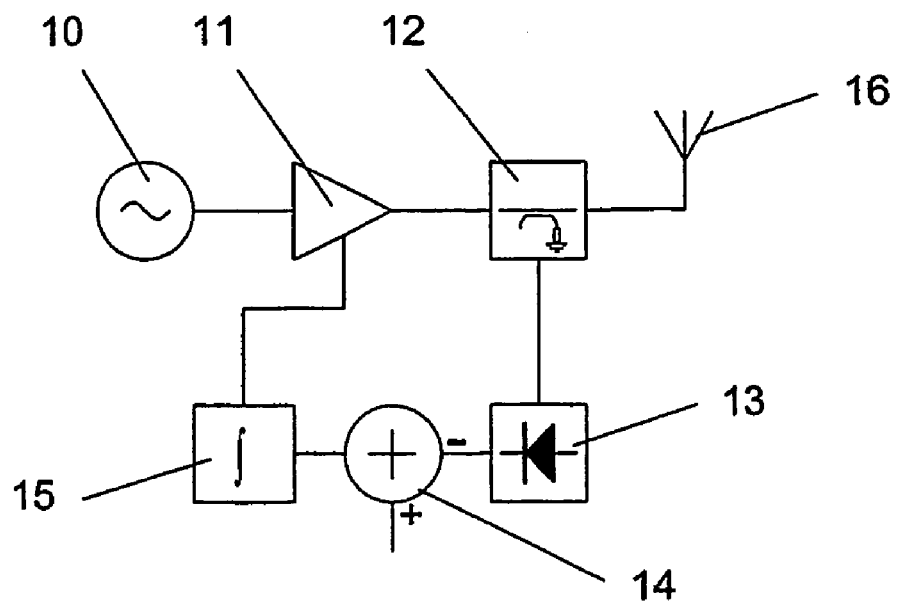
Figure 2:
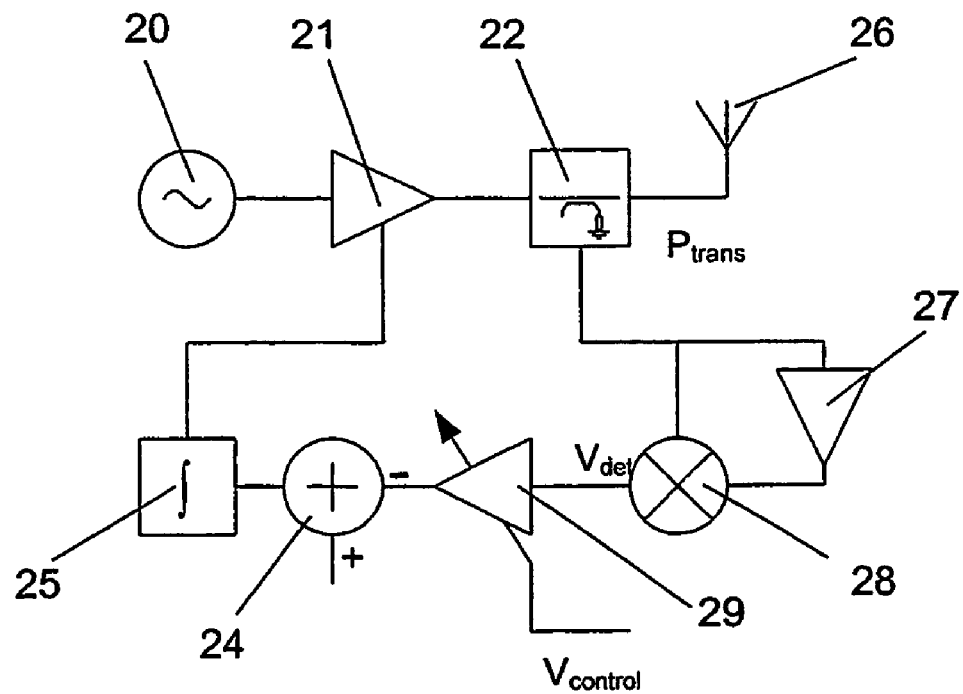

In the circuit shown in FIG. 2, like components to those of FIG. 1 are shown with reference numerals raised by 10. The transmitted signal $P_{trans}$ is sampled in a coupler 22, typically realised using a microstrip based directional coupler, and is then multiplied by itself in a mixer circuit or multiplier 28, the multiplying input being derived from the sampled output by an RF limiting amplifier 27. This process results in the production of sum and difference frequency components of which the difference component is a DC voltage equivalent to the full-wave rectification of the sampled RF voltage waveform $P_{trans}$. The DC component is fed to a variable gain amplifier 29 which has a control reference input $V_{control}$ and an output fed to the power amplifier's control input via a comparator 24 and an integrator 25.

By way of explanation, the output of the mixer circuit 28 is the product of the two inputs:

$$\text{Output} = A_1 \cdot \cos(\omega \cdot t) \cdot A_2 \cdot \cos(\omega \cdot t)$$

The trigonometric identity for cos (a+b) and cos (a−b) can be used to express the multiplication as a sum and difference of the frequency terms (ωt)

$$\text{Output} = \frac{A_1 \cdot A_2}{2} \cos(\omega \cdot t + \omega \cdot t) + \frac{A_1 \cdot A_2}{2} \cos(\omega \cdot t - \omega \cdot t) \Rightarrow$$

$$\frac{A_1 \cdot A_2}{2} \cos(2 \cdot \omega \cdot t) + \frac{A_1 \cdot A_2}{2} \cos(0)$$

Thus the multiplier output has a twice input frequency component and a DC component (cos (0)=1). The twice frequency term can be removed with a suitable filter (not shown).

Figure 3:
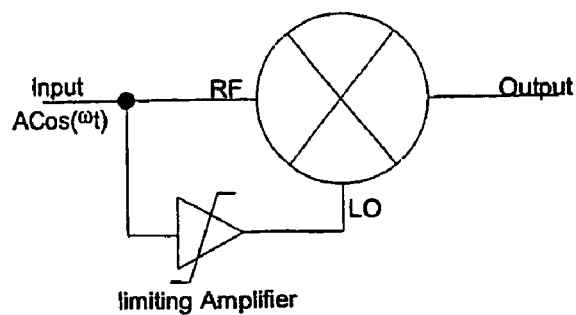
FIG. 3 shows detail of an idealised multiplier circuit which used in the control loop.

FIG. 3, which illustrates the idealised mixer circuit or multiplier 28, shows that one of the inputs is an output from the limiting amplifier 27 and therefore has an amplitude that is independent of PA output power. Thus the DC component can be represented simply as $$\text{Output} = \frac{kA_1}{2} \cos(0) \text{ where } k \text{ is a constant.}$$

In this way the multiplier output can be arranged to be directly proportional to the output power $P_{trans}$ of the PA, ie. the power detection circuit has a linear transfer function.

BRIEF DESCRIPTION OF THE INVENTION

The analysis always holds even if the RF output signal is angle modulated. Only amplitude modulation is transferred to DC.

Figure 4:
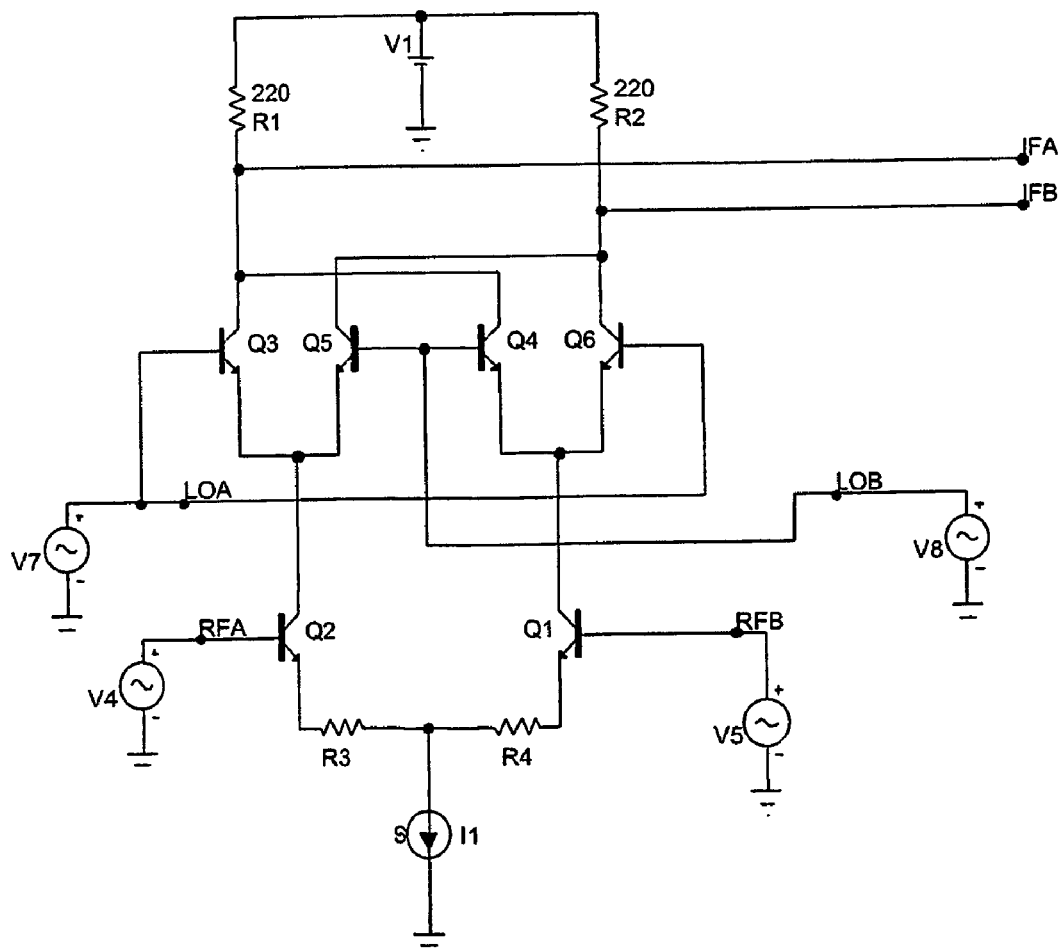
FIG. 4 is a circuit diagram of a conventional Gilbert cell type mixer which offers four quadrant multiplication.

In an RFIC (radio frequency integrated circuit) application the multiplier element is likely to be realised with a Gilbert cell type mixer which offers four quadrant multiplication. A generic Gilbert cell, well known in the art, is shown in FIG. 4. The linear differential RF voltage is applied to RFA and RFB. The differential local oscillator voltage is applied to LOA and LOB. As the local oscillator sine wave swings from positive to negative the two differential amplifiers formed by Q3/Q5 and Q4/Q6 steer the currents from Q1 and Q2 to either R1 or R2. This has the effect of reversing the phase of the RF voltage appearing differentially at R1 and R2 at a rate equal to the local oscillator frequency. This is equivalent to multiplication in the time domain, resulting in sum and difference frequency products appearing differentally at IFA and IFB.

Locating the VGA 29 as shown in FIG. 2, allows it to operate at DC where the circuit complexity is significantly reduced from what it would be were the alternative employed (namely to use a VGA to control RF power fed into the conventional Schottky diode). This can be done because the mixer detector 27, 28 does not suffer the same drawbacks as the diode detector of the prior art and is able to maintain a well-defined characteristic over a wide range of power levels.

The VGA control reference $V_{control}$ sets the output power and can also be used to institute the power ramp profile desired for TDMA applications. This is a departure from a typical power control loop where normally the comparator reference determines the output power and ramp profile. The VGA gain effectively sets the level of power and the transmitted output power $P_{trans}$ becomes proportional to the VGA gain.

Figure 5:
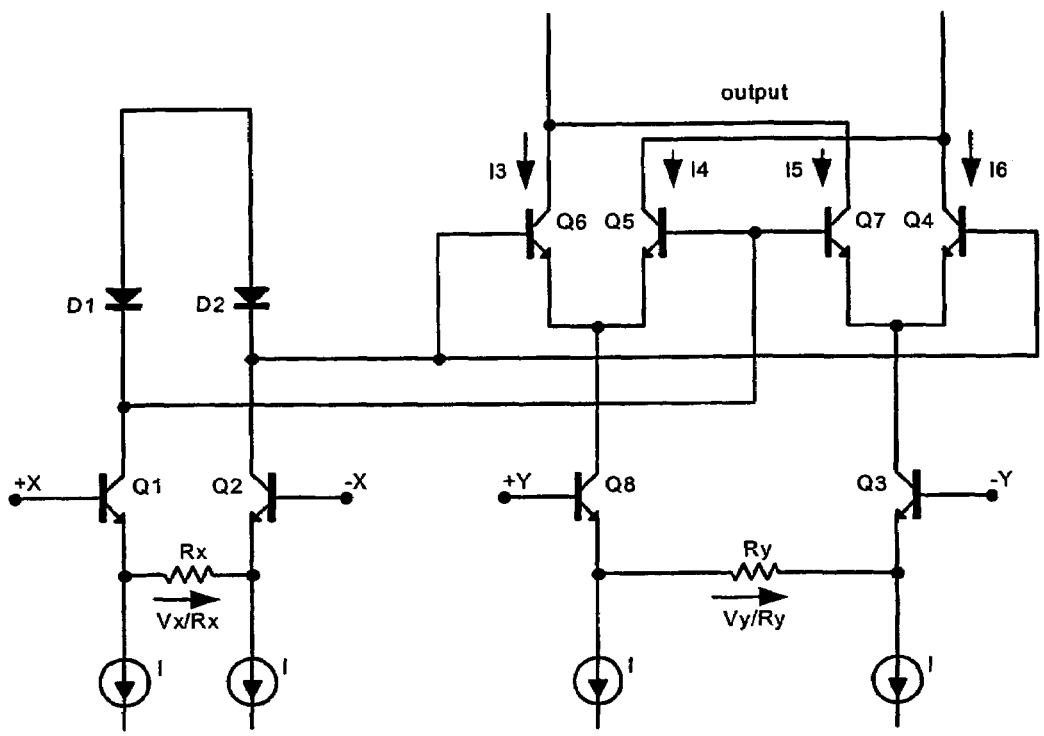
FIG. 5 is a circuit diagram of a typical four quadrant multiplier.

A typical four quadrant multiplier, as shown in FIG. 5, can be used to implement the VGA function. See, for example, B. Gilbert "A precise Four-Quadrant Multiplier with Sub-nanosecond Response", IEEE Journal of Solid-State Circuits, VOL SC-3, No. 4, December 1968. The main difference to the Gilbert cell is that the local oscillator inputs are linearised. It produces an output current $I_0$ that is proportional to the product of the input voltages, see the following equation.

$$I_o = (I_3 + I_5) - (I_4 + I_6) = \frac{2 \cdot Vx \cdot Vy}{I \cdot Rx \cdot Ry}$$

In this example, the detector output would be connected across the Y input and the power control reference across the X input.

The implementation of the comparator and integrator will not be further described as their design need not differ fundamentally from those used in the prior art.

Figure 7:
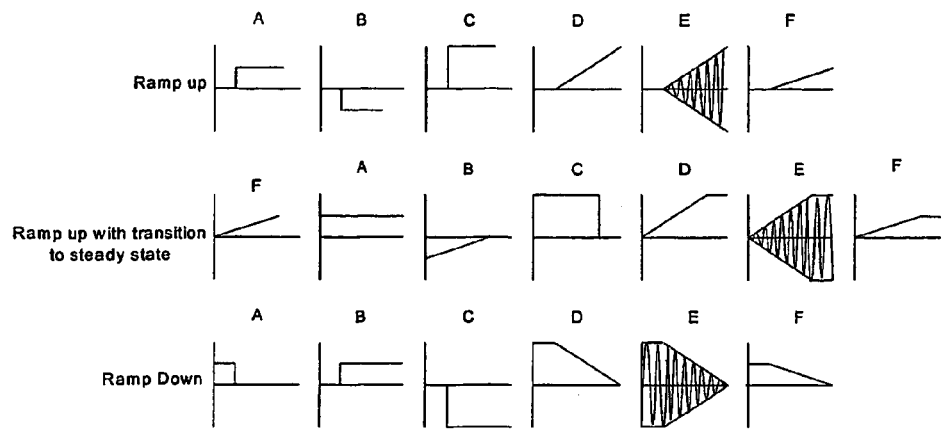
FIG. 7 illustrates the operation of the control loop for a typical TDMA application.

The operation of the control loop for a typical TDMA application is broken into three different time intervals which are illustrated in FIG. 7.

Power ramping after initialisation.

The transition from ramp up to steady state (levelled power).

Ramp down.

Figure 6:
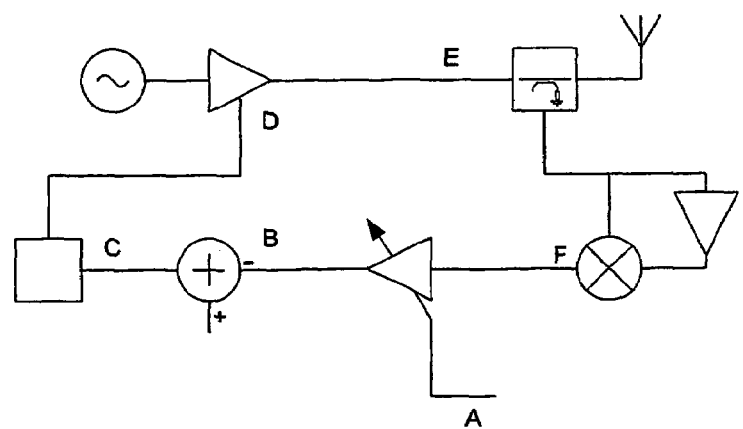
FIG. 6 is a circuit diagram the same as FIG. 2, but showing points at which signal forms are described in the text below.

A diagram of the loop observation points A to F, referenced in FIG. 7, is shown in FIG. 6, which is substantially identical to FIG. 2, but has had the reference numerals removed for clarity to allow the points A to F to be shown at the desired positions.

Power ramping after initialisation involves the following aspects within the circuit:

1. PA output is assumed to be initially zero. The detector output voltage is therefore zero.
2. A voltage is applied to set the output power (A).
3. The VGA inverts and amplifies the detector output (B). The inversion is required so that the comparator input is the right sense
4. As the negative VGA signal is smaller than the comparator reference the output of the comparator is positive (C).
5. The comparator output is integrated—the resulting output is a ramp signal (integral of a step input) (D). This is the control signal for the PA
6. The voltage on the control pin increases the output power of the PA (E).
7. The detector output increases as the PA power increases (F).

Transition from ramp up to steady state has the following aspects:

1. The signal at (B) increases until it is equal to the reference voltage. The output of the comparator (C) is therefore zero.
2. A zero input to the integrator terminates the ramp signal (D).
3. The output power of the PA is therefore constant (E).
4. The loop is now closed Any residual steady state error is determined by the open loop gain. A high loop gain will lead to a smaller error.

The ramp down process involves:

1. The voltage of the power setting reference is reduced (A).
2. This forces the VGA output to be positive (B) (there is an inversion).
3. The output of the comparator becomes negative (C).
4. This negative voltage causes the integrator to ramp down (D).
5. Which in turn causes the RF power at the PA output to reduce (E).
6. As the RF power reduces the output from the detector also reduces (F).

Provided adequate control loop bandwidth exists, the control loop will follow any profiling applied to the ramping-up and ramping-down process.

DESCRIPTION OF THE INVENTION

The simplest implementation of the power detection part of the control loop has been depicted in FIG. 2. This implementation avoids any detected power variation resulting from AM/PM conversion in the power amplifier 21, provided the limiting amplifier 27 exhibits no AM/PM conversion itself over the desired operating range. In practise, a disadvantage of such an implementation is that the limiting amplifier 27 must work over quite a wide range. This means that the limiting amplifier's gain is determined by the minimum required signal to be detected. Large gain values could lead to issues with RF stability.

Two alternatives to the limiter approach will therefore now be described.

A first alternative is the use of an analogue four quadrant multiplier rather than a conventional Gilbert cell based mixer to square the sampled RF signal. Either the resultant DC signal must then be square-rooted, or the VGA control signal must be squared in order to maintain a linear control transfer function. Thus, high gain signal limiting is avoided.

Figure 8:
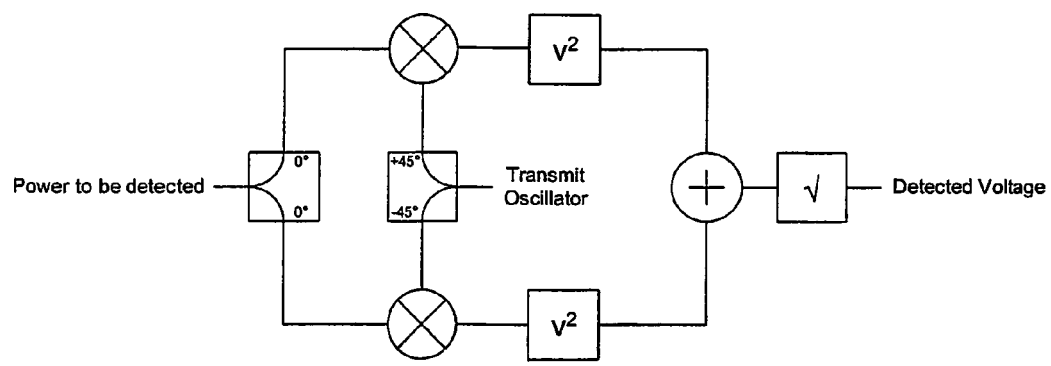
FIG. 8 is a circuit which allows the use of the RF oscillator at the input to the power amplifier as the detector's local oscillator.
Figure 9:
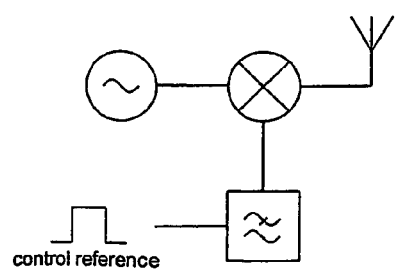
FIG. 9 illustrates an idealised control loop.

The second alternative is the use of the RF oscillator 20 at the input to the power amplifier 21 as the detector's local oscillator. Whilst this completely removes problems associated with limiting amplifier stability or lack of detection sensitivity, it leaves the system prone to detection errors due to AM/PM conversion in the power amplifier 21. However, this problem can be removed by means of the architecture shown in FIG. 8. In this circuit, in phase and quadrature DC components of the transmitted signal are taken by virtue of two identical Gilbert cells and a quadrature local oscillator derived from the transmit oscillator. The instantaneous DC components represent the Cartesian vector representation of the transmitted signal. Any AM/PM conversion in the power amplifier causes a phase shift to the vector, but the length of the vector always remains proportional to the transmitted power. The vector length is calculated by the Pythagoras theorem.

There still remain some potential practical disadvantages:

An additional connection to the power control loop is required.

There is an increased possibility of unwanted transmitter oscillator leakage to the antenna.

Squaring and square-rooting functions are done by analogue circuitry.

However, these are outweighed by the ability to provide a linear power response.

An improvement to the sensitivity of the power control loop can be effected with the inclusion of automatic DC offset correction.

What is claimed is:

1. An RF transmitter power control system having an oscillator;

a power amplifier receiving the output of the oscillator as a first input, having a control input, and generating an output signal for passing to an antenna;

a sampling device for deriving a signal representative of the output signal;

a multiplier for multiplying the representative signal by itself to provide an output component which is linearly related to the representative signal;

a variable gain amplifier receiving the linear output component of the multiplier as a first input and having a variable control input as a control reference and an output;

a comparator for comparing the output of the variable gain amplifier with a reference and producing a difference signal; and an integrator for integrating the difference signal and providing it as a control input to the power amplifier.

2. A system according to claim 1, wherein the oscillator is a voltage controlled oscillator.

3. A system according to claim 1, wherein the multiplier comprises an analogue multiplier.

4. A system according to claim 1, wherein the multiplier comprises a Gilbert cell.

5. A system according to claim 1, wherein the multiplier has a limiting amplifier input.

6. A system according to claim 1, wherein the RF oscillator provides a local oscillator for the multiplier.

7. A system according to claim 1, wherein the variable gain amplifier comprises a four quadrant multiplier.

8. An RF transmitter having a power control system according to claim 1.

9. A cellular telephone handset having an RF transmitter according to claim 8.

* * * * *